(12) United States Patent
Chun-Hung et al.

(10) Patent No.: US 10,749,076 B2
(45) Date of Patent: Aug. 18, 2020

(54) LIGHT-EMITTING DEVICE

(71) Applicant: EPISTAR CORPORATION, Hsinchu (TW)

(72) Inventors: Liu Chun-Hung, Hsinchu (TW); Liao Shih-An, Hsinchu (TW); Liu Chien-Liang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 339 days.

(21) Appl. No.: 15/637,852

(22) Filed: Jun. 29, 2017

(65) Prior Publication Data

US 2019/0006561 A1    Jan. 3, 2019

(51) Int. Cl.
| | |
|---|---|
| H01L 33/00 | (2010.01) |
| H01L 33/38 | (2010.01) |
| H01L 33/60 | (2010.01) |
| H01L 33/44 | (2010.01) |
| H01L 33/48 | (2010.01) |
| H01L 33/58 | (2010.01) |
| H01L 25/075 | (2006.01) |
| H01L 33/54 | (2010.01) |

(52) U.S. Cl.
CPC .......... *H01L 33/387* (2013.01); *H01L 33/44* (2013.01); *H01L 33/60* (2013.01); *H01L 25/0753* (2013.01); *H01L 33/486* (2013.01); *H01L 33/54* (2013.01); *H01L 33/58* (2013.01)

(58) Field of Classification Search
CPC ....... H01L 33/387; H01L 33/60; H01L 33/44; H01L 33/58; H01L 33/54
USPC .......................................................... 257/98
See application file for complete search history.

(56) References Cited

U.S. PATENT DOCUMENTS

| | | | |
|---|---|---|---|
| 2010/0214508 A1* | 8/2010 | Ouchi | G02B 6/0038 349/64 |
| 2011/0175117 A1* | 7/2011 | Jagt | H01L 33/44 257/88 |
| 2011/0241030 A1* | 10/2011 | Kim | H01L 25/16 257/88 |
| 2015/0349231 A1* | 12/2015 | Hsieh | H01L 33/642 257/98 |
| 2016/0190409 A1 | 6/2016 | Kuo et al. | |
| 2016/0351764 A1* | 12/2016 | Cha | H01L 33/58 |
| 2017/0323870 A1* | 11/2017 | Ting | H01L 33/507 |

\* cited by examiner

*Primary Examiner* — Georgia Y Epps
*Assistant Examiner* — Kevin Wyatt
(74) *Attorney, Agent, or Firm* — Ditthavong & Steiner, P.C.

(57) ABSTRACT

A light-emitting device includes a light-emitting structure with an electrode layer, a light-transmitting body, a reflective layer and a metal bump. The light-transmitting body covers the light-emitting structure, and has a first side surface and a second side surface which are substantially perpendicular to each other. The reflective layer covers the first side surface without covering the second side surface. The metal bump is directly formed on the electrode layer.

14 Claims, 12 Drawing Sheets

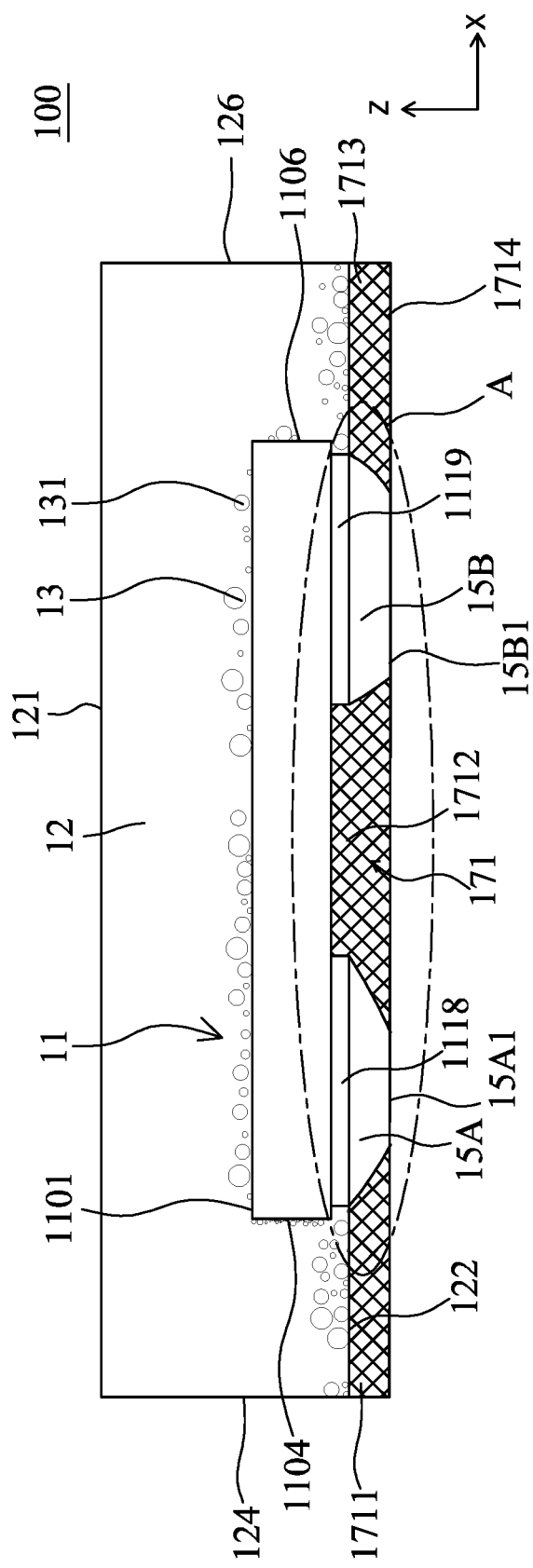
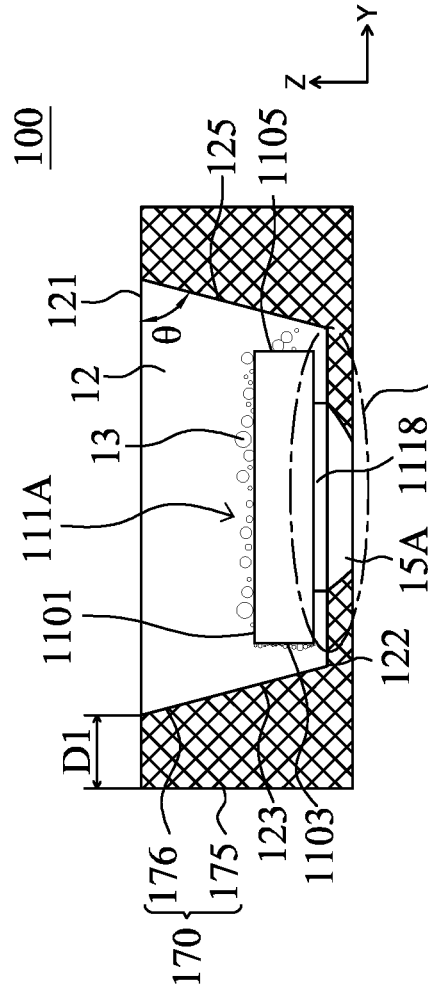
FIG. 1B
FIG. 1C

LIGHT-EMITTING DEVICE

TECHNICAL FIELD

The present disclosure relates to a light-emitting device and in particular to a light-emitting device comprising a reflective layer covering two sides of a light-transmitting body.

DESCRIPTION OF THE RELATED ART

The light-emitting diodes (LEDs) have the characteristics of low power consumption, long operational life, small volume, quick response and stable opto-electrical property of emitted light. Recently, the light-emitting diodes gradually are used in a backlight module of a liquid crystal display.

SUMMARY OF THE DISCLOSURE

A light-emitting device includes a light-emitting structure with an electrode layer, a light-transmitting body, a reflective layer and a metal bump. The light-transmitting body covers the light-emitting structure, and has a first side surface and a second side surface which are substantially perpendicular to each other. The reflective layer covers the first side surface without covering the second side surface. The metal bump is directly formed on the electrode layer.

The following description illustrates embodiments and together with drawings to provide a further understanding of the disclosure described above.

BRIEF DESCRIPTION OF THE DRAWINGS

FIG. 1B shows a cross-sectional view taken along lines X-X of FIG. 1A.

FIG. 1C shows a cross-sectional view taken along lines Y-Y of FIG. 1A.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed. It is noted that the elements not drawn or described in the figure can be included in the present application by the skilled person in the art.

Figure 1A:
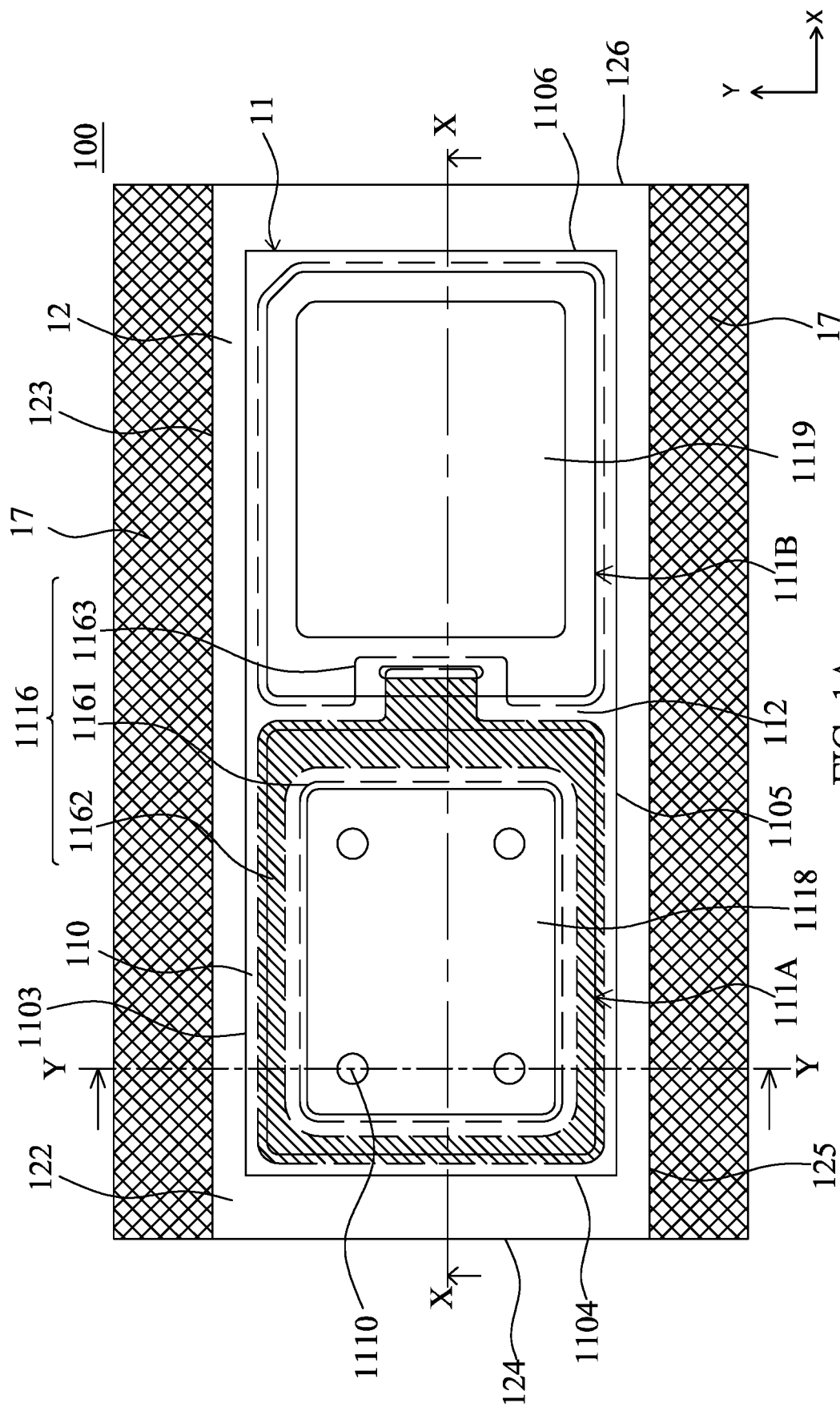
FIG. 1A shows a top view of a light-emitting device in accordance with an embodiment of the present disclosure.
Figure 1D:
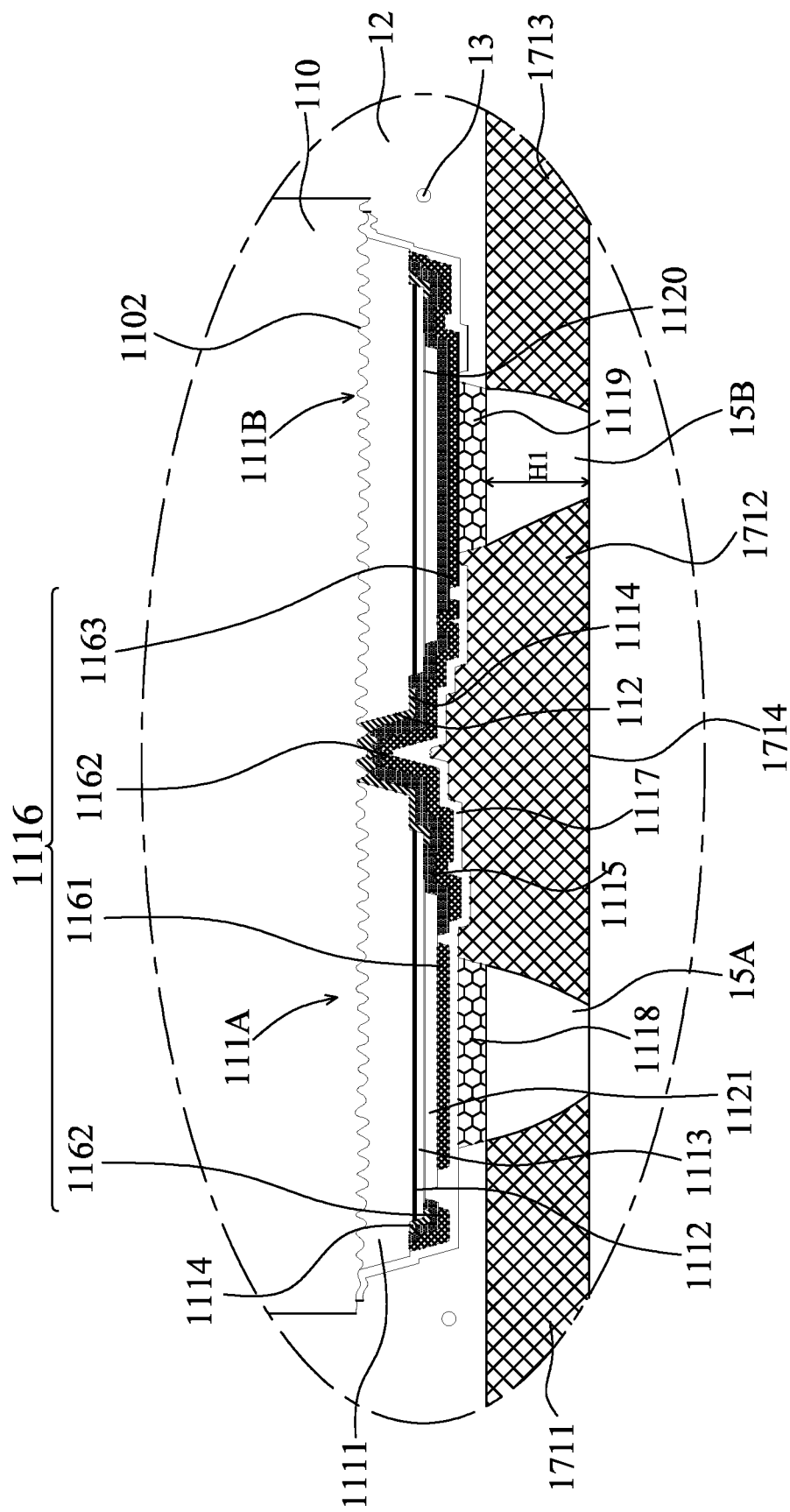
FIG. 1D shows an enlarged view of a circled area A in FIG. 1B.
Figure 1E:
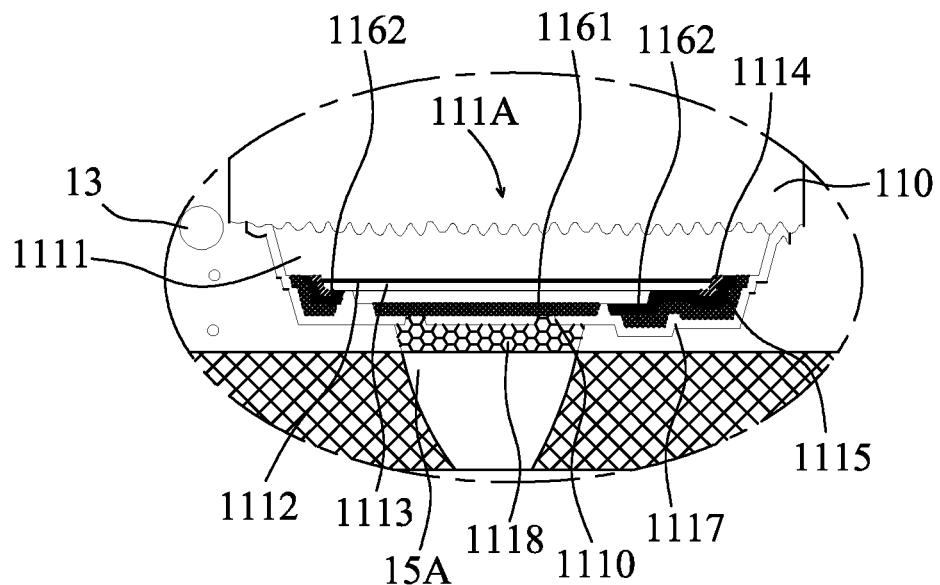
FIG. 1E shows an enlarged view of a circled area B in FIG. 1C.
Figure 1F:
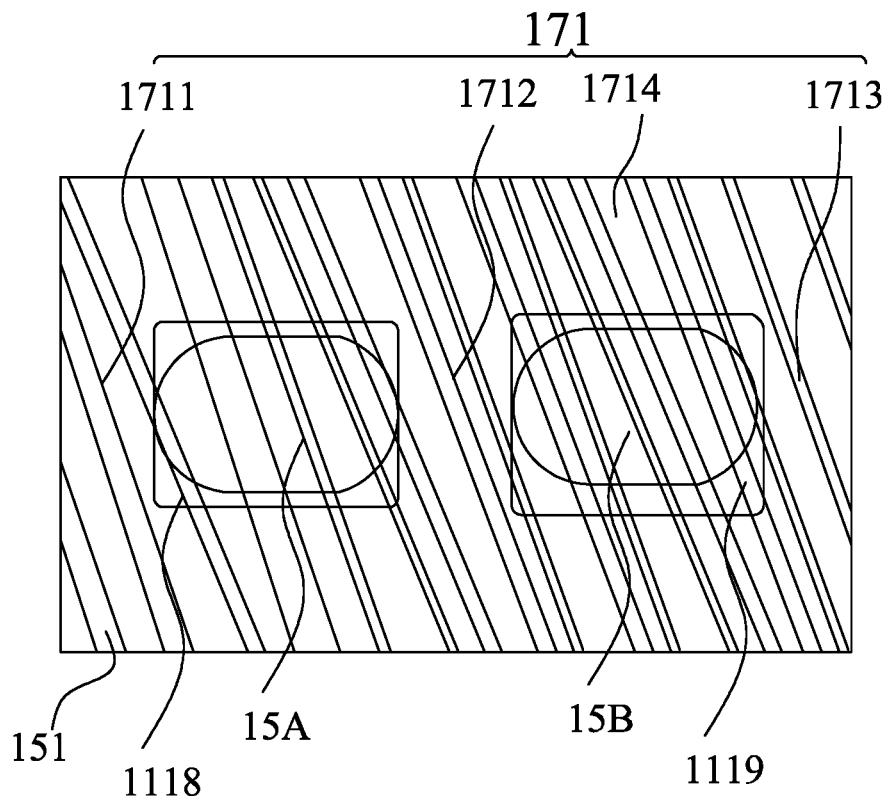
FIG. 1F shows a bottom view of a light-emitting device in accordance with an embodiment of the present disclosure.

FIG. 1A shows a top view of a light-emitting device 100 in accordance with an embodiment of the present disclosure. For clear illustration, FIG. 1A only shows some layers and each layer is drawn in solid line (a conductive layer 1116 is drawn in dot line and will be described later) regardless of its material being non-transparent, transparent, or semi-transparent. FIG. 1B shows a cross-sectional view taken along lines X-X of FIG. 1A. FIG. 1C shows a cross-sectional view taken along lines Y-Y of FIG. 1A. FIG. 1D shows an enlarged view of a circled area A in FIG. 1B. FIG. 1E shows an enlarged view of a circled area B in FIG. 1C. FIG. 1F shows a bottom view of the light-emitting device 100. For simplified illustration, a light-emitting structure 11 or light-emitting body 111A is shown as cuboid in FIGS. 1B and 1C, and the detailed structure will be described in FIGS. 1D and 1E.

Referring to FIGS. 1A, 1B, and 1D, the light-emitting device 100 includes a light-emitting structure 11, a light-transmitting body 12, a wavelength-conversion body 13, metal bump 15A, 15B, and a reflective layer 17. The light-emitting structure 11 includes a patterned substrate 110 and two light-emitting bodies 111A, 111B. The patterned substrate 110 is substantially a cuboid and includes a top surface 1101, a bottom surface 1102 opposite to the top surface 1101, and four side surfaces (a first side surface 1103, a second side surface 1104, a third side surface 1105, and a fourth side surface 1106) connecting between the top surface 1101 and the bottom surface 1102. The bottom surface 1102 is a patterned surface with a concave-convex structure in a regular or irregular arrangement. The light-transmitting body 12 covers the top surface 1101, the four side surface 1103~1106 and a portion of the bottom surface 1102.

Referring to FIG. 1D, the light-emitting structure 11 includes the patterned substrate 110, the two light-emitting bodies 111A, 111B commonly formed on the patterned substrate 110, a trench 112 formed between the two light-emitting bodies 111A, 111B such that the two light-emitting bodies 111A, 111B are physically separated from each other. Each light-emitting body 111A, 111B includes a first-type semiconductor layer 1111, an active layer 1112, and a second-type semiconductor layer 1113. A first insulation layer 1114 is formed in the trench 112 and covers the first-type semiconductor layers 1111 of the light-emitting bodies 111A, 111B to avoid undesired electrical path (short circuit). A mirror layer 1121 is formed on the second-type semiconductor layer 1113. A second insulation layer 1115 is formed on the first insulation layer 1114, the second-type semiconductor layers 1113 of the light-emitting bodies 111A, 111B and the mirror layer 1121 to expose the mirror layer 1121 and a portion of the second-type semiconductor layer 1113 of the light-emitting body 111B. A conductive layer 1116 is formed on the second insulation layer 1115. In addition, the second insulation layer 1115 covers a sidewall of the first insulation layer 1114. The conductive layer 1116 covers a portion of a sidewall of the second insulation layer 1115 and extends to the mirror layer 1121 of the light-emitting body 111B. A third insulation layer 1117 is formed on the conductive layer 1116, covers the light-emitting bodies 111A, 111B and exposes a portion of the conductive layer 1116. A first electrode layer 1118 and a second electrode layer 1119 are formed on the light-emitting bodies 111A, 111B, respectively. The electrical connection between the light-emitting bodies 111A, 111B is described later. An ohmic contact layer 1120 is optionally formed between the second-type semiconductor layer 1113 and the mirror layer 1121 for lowering a driving voltage of the light-emitting device 100.

For clear illustration, the conductive layer 1116 of FIG. 1A is drawn in a dot line. Referring to FIGS. 1A, 1D, and 1E, the conductive layer 1116 has a first region 1161, a second region 1161 (the hatch area in FIG. 1A) and a third region 1163. The first region 1161 is formed merely on the light-emitting body 111A and physically separated from the second region 1162. The second region 1162 surrounds the first region 1161. The second region 1162 contacts the first-type semiconductor layer 1111 of the light-emitting body 111A, and is further formed on the second insulation layer 1115 in the trench 112 to extend to the second-type semiconductor layer 1113 of the light-emitting body 111B so the conductive layer 1116 serially connects the light-emitting body 111A with the light-emitting body 111B (due to the position of X-X line, the electrical connection is not shown in FIG. 1D).

Referring to FIGS. 1A, 1D and 1E, a plurality of holes 1110 is formed in the third insulation layer 1110, and the holes 1110 are formed merely on the light-emitting body 111A and not formed on the light-emitting body 111B. The first electrode layer 1118 extends into the holes 1110 and electrically connected to the first region 1161 of the conductive layer 1116 on the light-emitting body 111A so the first electrode layer 1118 is electrically connected to the second-type semiconductor layer 1113 of the light-emitting body 111A. The third region 1163 of the conductive layer 1116 is formed merely on the light-emitting body 111B. The second electrode layer 1119 contacts directly the third region 1163 of the conductive layer 1116 exposed from the third insulation layer 1117. The third region 1163 of the conductive layer 1116 contacts the first-type semiconductor layer 1111 of the light-emitting body 111B. In this embodiment, for example, when the first electrode layer 1118 is electrically connected to a positive terminal of an external electrode and the second electrode layer 1119 is electrically connected to a negative terminal of the external electrode, a current flows through the first electrode layer 1118 in the holes, the first region 1161 of the conductive layer 1116, the second-type semiconductor layer 1113 of the light-emitting body 111A, the active layer 1112 of the light-emitting body 111A, the first-type semiconductor layer 1111 of the light-emitting body 111A, the second region 1162 of the conductive layer 1116, the second-type semiconductor layer 1113 of the light-emitting body 111B, the active layer 1112 of the light-emitting body 111B, the first-type semiconductor layer 1111 of the light-emitting body 111B, the third region 1163 of the conductive layer 1116 and to the second electrode layer 1119, so the light-emitting bodies 111A, 111B are electrically connected with each other in series and emit light. Moreover, based on the aforesaid structure, a process of forming holes 1110 on the light-emitting body 111B can be eliminated and the conductive layer 1116 covers the sidewalls of the light-emitting bodies 111A, 111B for enhancing the luminous flux (lumen) of the light-emitting device 100 and reducing the forward voltage of the light-emitting device 100.

In this embodiment, the first electrode layer 1118, the second electrode layer 1119 and the conductive layer 1116 can be made of metal, for example Au, Ag, Cu, Cr, Al, Pt, Ni, Ti, Sn or alloy thereof. The mirror layer 1121 can reflect light emitted from the light-emitting body and includes Ag, Al, or Distributed Bragg Reflector (DBR). The first insulation layer 1114 can be a single layer or a multilayer. When the first insulation layer 1114 is a single layer, it can comprise oxide, nitride, or polymer. The oxide can comprise $Al_2O_3$, $SiO_2$, $TiO_2$, $Ta_2O_5$, $AlO_x$. The nitride can comprise $AlN$ or $SiN_x$. The polymer can comprise polyimide or BCB. When the first insulation layer 1114 is a multilayer, it can be a stack structure for forming a Distributed Bragg Reflector whose material comprising $Al_2O_3$, $SiO_2$, $TiO_2$, $Ta_2O_5$, or $SiN_x$. The second insulation layer 1115 and the third insulation layer 1117 comprise a material referred to the material of the first insulation layer 1114.

Referring to FIGS. 1A, 1B and 1C, the light-transmitting body 12 encloses the light-emitting structure 11 and is substantially a cuboid. Accordingly, the light-transmitting body 12 is a rectangular in FIG. 1A. The light-transmitting body 12 has a top surface 121, a bottom surface 122 opposite to the top surface 121, and four side surfaces (a first side surface 123, a second side surface 124, a third side surface 125 and a fourth side surface 126) connecting between the top surface 121 and the bottom surface 122. In FIG. 1A, the first side surface 123 and the third side surface 125 are substantially parallel to each other and face each other, and they are the longer sides of the rectangle. The second side surface 124 and the fourth side surface 126 are substantially parallel to each other and face each other, and they are the shorter sides of the rectangle. The first side surface 123 is substantially perpendicular to the second side surface 124. The reflective layer 17 includes a side portion 170 and a bottom portion 171. The side portion 170 covers the first side surface 123 and the third side surface 125 without covering the second side surface 124 and the fourth side surface 126. The bottom portion 171 covers the bottom surface 122. The top surface 121 is not covered by the reflective layer 17. Similarly, the reflective layer 17 covers the side surface 1103 and the third side surface 1105 of the light-emitting structure 11 without covering the second side surface 1104 and the fourth side surface 1106.

Referring to FIG. 1C, the side portion 170 has an outer surface 175 and an inner surface 176. The outer surface 175 is substantially flat and perpendicular to the top surface 121. The inner surface 176 is an inclined surface inclined with respect to the top surface by an angle ($\theta$) of 60°~80°. Specifically, a distance (D1) between the inner surface 176 and the outer surface 175 is gradually increased in a direction from the top surface 121 to the bottom surface 122 of the light-transmitting body 12. The inner surface 176 reflects the light emitted from the light-emitting structure 11 toward the top surface 121 of the light-transmitting body 12. In other words, the reflective layer 17 reflects the light emitted from the light-emitting structure 11 toward the top surface 121 or/and side surfaces 124, 126 of the light-transmitting body 12 to exit the light-emitting device 100.

Furthermore, the reflective layer 17 is a mixture including a matrix and a plurality of reflective particles dispersed in the matrix so reflection of the light emitted from the light-emitted structure 11 occurs within the reflective layer 17 and the reflection is called diffuse reflection. The matrix is an insulation material and includes silicone-based material or epoxy-based material. The reflective particle includes $TiO_2$, $SiO_2$, $BaSO_4$, or $Al_2O_3$. Since the thickness of the reflective layer 17 correlates with its reflectivity which varies with wavelength, the thickness of the reflective layer 17 (the maximum distance between the inner surface 176 and the outer surface 175) ranges from 50 μm~160 μm. When the thickness of the reflective layer 17 is less than 50 μm, the reflective layer 17 has a reflectivity of less than 90% at 430 nm~450 nm, has a reflectivity of less than 88% at 540 nm~570 nm, and has a reflectivity of less than 80% at 620 nm~670 nm. When the thickness of the reflective layer 17 is about 160 μm, the reflective layer 17 has a reflectivity of greater than 95% at 430 nm~450 nm, at 540 nm~570 nm, and at 620 nm~670 nm. However, the thickness of the reflective layer 17 is greater than 160 μm, which results in an increase in the thickness of the light-emitting device 100 and the cost for making thereof for limiting the applicability, for example, mobile phone, liquid crystal display, wearable apparatus like watch, wristband, ring, and so on. In another embodiment, based on various applications, the reflective layer 17 has a thickness greater than 160 μm, or in a range of 50 μm~1000 μm.

Referring to FIGS. 1B, 1D and 1F, the bottom portion 171 of the reflective layer 17 is formed on the bottom surface 122 and has a first part 1711, a second part 1712 and a third part 1713. As shown in FIG. 1D, the first part 1711, the second part, 1712 and the third part 1713 are separated from each other. The first part 171 covers the metal bump 15A, the second part 1712 covers the metal bumps 15A, 15B, and the third part 1713 covers the metal bump 15B. As shown in FIG. 1F, actually, the first part 1711, the second part, 1712 and the third part 1713 are connected to each other.

Metal bump 15A, 15B contact and are electrically connected to the first electrode layer 1118 and the second electrode layer 1119, respectively. Each of the metal bumps 15A, 15B has a substantially flat bottom surface 15A1, 15B1. In addition, the bottom portion 171 also has a substantially flat bottom surface 1714. The definition of "substantially flat" herein is when the light-emitting device 100 is observed by scanning electron microscope (SEM) at 60×~100× magnification, the bottom surface 15A1, 15B1, 1714 are not substantially and severely rugged. However, when the light-emitting device 100 is observed by scanning electron microscope (SEM) at larger than 400× magnification, or measured by atomic force microscope (AFM), the bottom surface 15A1, 15B1, 1714 are rough with a roughness of 2~3 μm/mm².

The metal bump (15A, 15B) includes a lead-free solders containing at least one material selected from the group consisting of tin, copper, silver, bismuth, indium, zinc, and antimony. The metal bumps 15A, 15B have a height (H1) between 20 μm~150 μm. In one embodiment, the metal bump is formed by using reflow soldering process. Specifically, a solder paste is placed on the electrode layer and then heated in a reflow oven to melt the solder paste and create a joint, thereby forming the metal bumps 15A, 15B. The solder paste can include Sn—Ag—Cu, Sn—Sb or Au—Sn, and have a melting point greater than 215° C., or greater than 220° C., or of 215° C.~240° C. (for example, 217° C., 220° C., 234° C.) In addition, a peak temperature in the reflow soldering process (the peak temperature is usually happened in a stage, called "reflow zone") is greater than 250° C., or greater than 260° C., or of 250° C.~270° C. (for example, 255° C., 265° C.).

Referring to FIG. 1F, the metal bumps 15A, 15B have a plurality of scratched lines 151 formed thereon and the scratched lines 151 can be observed by optical microscope. The scratched lines 151 can also extend to areas other than the metal bumps 15A, 15B, such as the bottom surface 1714 of the reflective layer 17. Specifically, the scratched line 151 is substantially straight line which is continuously extended over the bottom surfaces 1714, 15A1, 15B1. The detailed description will be discussed later.

Referring to FIGS. 1B and 1C, the wavelength conversion body 13 is formed within the light-transmitting body 12. In this embodiment, the wavelength conversion body 13 includes a plurality of wavelength conversion particles 131 dispersed in a matrix. The wavelength conversion particles 131 covers the top surface 1102, the first side surface 1103, the second side surface 111, a portion of the third side surface 1105 and a portion of the fourth side surface 1106. A portion of the third side surface 1105 and a portion of the fourth side surface 1106 are not covered by the wavelength conversion particles 131. Alternatively, the wavelength-conversion body 13 and/or the light-transmitting body 12 further include diffusion powder. The matrix includes epoxy, silicone, PI, BCB, PFCB, Acrylic resin, PMMA, PET, PC or polyetherimide. The light-transmitting body 12 includes epoxy, silicone, PI, BCB, PFCB, Acrylic resin, PMMA, PET, PC or polyetherimide. When the matrix of the wavelength-conversion body 13 has a material same as the light-transmitting body 12, an interface therebetween observed by scan electron microscope (SEM) is vague and unclear. Or, there is no interface existing between the wavelength-conversion body 13 and the light-transmitting body 12, that is, the wavelength-conversion particles dispersed in the light-transmitting body 12.

The wavelength conversion particles 131 have a particle size of 5 μm~100 μm and include one or more (a plurality of) kinds of inorganic phosphor, organic fluorescent colorants, semiconductors, or combinations thereof. The inorganic phosphor includes but is not limited to, yellow-greenish phosphor or red phosphor. The yellow-greenish phosphor comprises aluminum oxide (such as YAG or TAG), silicate, vanadate, alkaline-earth metal selenide, or metal nitride. The red phosphor includes fluoride ($K_2TiF_6$: $Mn^{4+}$, $K_2SiF_6$:$Mn^{4+}$), silicate, vanadate, alkaline-earth metal sulfide (CaS), metal nitride oxide, a mixture of tungstate and molybdate. The weight percentage (w/w) of the wavelength-conversion particles within the matrix is between 50%~70%. The semiconductors include crystal with nano-sizes, for example, quantum dot. The quantum dot can be ZnS, ZnSe, ZnTe, ZnO, CdS, CdSe, CdTe, GaN, GaP, GaSe, GaSb, GaAs, AlN, AlP, AlAs, InP, InAs, Te, PbS, InSb, PbTe, PbSe, SbTe, ZnCdSeS, CuInS, $CsPbCl_3$, $CsPbBr_3$, or $CsPbI_3$.

The diffusing powder includes titanium dioxide, silicon dioxide, aluminum oxide, zinc oxide, or zirconium dioxide for diffusing the light emitted from the light-emitting structure 11. The weight percentage (w/w) of the diffusing powder within the matrix is between 0.1%~0.5% and has a particle size between 10 nm~100 nm or between 10 μm~50 μm. In an embodiment, the weight percentage of the diffusing powder (or the wavelength-conversion particles) within the matrix can be measured by a thermogravimetric analyzer (TGA). Specifically, the matrix is removed (through evaporation or pyrolysis) by increasing the temperature to a certain temperature so the diffusing powder (or the wavelength-conversion particles) is remained. The change of the weight can be measured and the weight of the matrix and the weight of the diffusing powder (or the wavelength-conversion particles) can be respectively derived from the change of the weight, and the weight percentage of the diffusing powder within the matrix can be calculated. Or, the total weight of the matrix and the diffusing powder (or the wavelength-conversion particles) can be measured first, and a solvent is applied to remove the matrix so the weight of the diffusing powder (or the wavelength-conversion particles) can be measured. Then, the weight percentage of the diffusing powder (or the wavelength-conversion particles) within the matrix can be calculated.

The wavelength conversion particles 131 can absorb a first light emitted from the light-emitting structure 11 and convert the first light to a second light having a spectrum different from that of the first light. The first light is mixed with the second light to produce a third light. In this embodiment, the third light has chromaticity coordinates (x, y) on CIE 1931 chromaticity diagram, wherein 0.27≤x≤0.285; 0.23≤y≤0.26. In another embodiment, the first light is mixed with the second light to produce a third light, such as a white light. Based on the weight percentage and the material of the wavelength-conversion particles, the light-emitting device has a correlated color temperature of about 2200K~6500K (ex. 2200K, 2400K, 2700K, 3000K, 5000K' 5700K, 6500K) under a thermal stable state with a color point (CIE x, y) within a seven-step MacAdam ellipse. In another embodiment, the first light is mixed with the second light to produce purple light, amber light, green light, yellow light or other non-white light.

In FIGS. 1A~1C, the first side surface 123 and the third side surface 125 are covered by the reflective layer 17, and the bottom surface 122 is also covered by the reflective layer 17, therefore, the light-emitting device 100 has three light emitting surfaces. In other words, the light emitted from the light-emitting structure 11 pass directly through the top surface 121, the second side surface 124 and the fourth side surface 126 of the light-transmitting body 12 to exit the light-emitting device 100. The light-emitting angle of the light-emitting structure 11 is about 140° so more than 50% of light emits outward from the top surface 1101 (or the top surface 121 of the light-transmitting body 12). The top surface 1101 of the light-emitting structure 11 is defined as a main light-emitting surface. The light-emitting directions of the light-emitting structure 11 and the light-emitting device 100 are identical, that is, light emit outward along the Z axis (exiting the light-emitting device 100). Accordingly, the main light-emitting surface of the light-emitting structure 11 and the light-emitting surface of the light-emitting device 100 are substantially parallel to each other. The light-emitting angle is defined as a range of angle from the angle of maximum luminous intensity to the angle of half (50%) of the maximum luminous intensity. The detailed description of the light-emitting angle can be referred to the content disclosed in the TW patent application 103104105.

In one embodiment, the reflective layer 17 includes metal such as Au, Ag, Cu, Al, Pt, Ni, or Rh. Accordingly, reflection of the light emitted from the light-emitted structure 11 occurs at the reflective layer 17 and the reflection is called specular reflection. In addition, when the reflective layer 17 is metal and has a thickness of 50~200 Å, its reflectivity is 99% so a thickness of the light-emitting device 100 in the Y direction can be reduced and the applicability of the light-emitting device 100 (for example, mobile phone, liquid crystal display, wearable apparatus (watch, wristband, ring, etc.)) is therefore increased. The reflective layer 17 can be formed on the light-transmitting body 12 by sputtering, electroplating or chemical plating. Alternatively, an adhesive (not shown), such as $TiO_2$, can be formed between the reflective layer 17 and the light-transmitting body 12 for improving adhesion therebetween. Or, the light-transmitting body 12 is undergone a surface treatment (for example, He plasma, $O_2$ plasma, or $N_2$ plasma) and the reflective layer 17 is immediately formed thereon (that is, the reflective layer 17 contacts directly the light-transmitting body 12). The surface treatment improves adhesion between the reflective layer 17 and the light-transmitting body 12.

Two light-emitting bodies in FIG. 1A are electrically connected in series. In another embodiment, the light-emitting structure 11 can include one light-emitting body, or at least two or not less than two light-emitting bodies which are electrically connected in series, in parallel or series-parallel or bridge. When the light-emitting structure includes a plurality of light-emitting bodies, the plurality of light-emitting bodies can be commonly formed on one substrate, or each of the plurality of light-emitting bodies has a substrate and then being mounted on a carrier. Alternatively, some of the light-emitting bodies are commonly formed on a substrate, and other light-emitting bodies have respective substrates and then are mounted commonly on a carrier. In addition, two light-emitting bodies in this embodiment are flip-chip structures and are electrically connected to each other by a conductive layer. In another embodiment, two light-emitting bodies are horizontal structure and are electrically connected to each other through wire bonding.

When the aforesaid light-emitting body has a heterostructure, the first-type semiconductor layer and the second-type semiconductor layer, for example a cladding layer or a confinement layer, provide holes and electrons, respectively, and each type layer has a bandgap greater than that of the active layer, thereby increasing the probability of electrons and holes combining in the active layer to emit light. The first-type semiconductor layer, the active layer, and the second-type semiconductor layer can be made of III-V group semiconductor materials, such as $Al_xIn_yGa_{(1-x-y)}N$ or $Al_xIn_yGa_{(1-x-y)}P$, wherein 0≤x, y≤1; (x+y)≤1. Depending on the material of the active layer, the light-emitting diode can emit a red light with a peak wavelength or dominant wavelength of 610~650 nm, a green light with a peak wavelength or dominant wavelength of 530~570 nm, a blue light with a peak wavelength or dominant wavelength of 450~490 nm, a purple light with a peak wavelength or dominant wavelength of 400~440 nm, or a UV light with a peak wavelength of 200~400 nm.

FIGS. 2A~2H show perspective views of making a light-emitting device in accordance with an embodiment of the present disclosure. FIGS. 3A~3H show cross-sectional views taken along line II-II of FIGS. 2A~2H, respectively. For simplification, the light-emitting structure 11 is shown as cuboid in FIGS. 2A~2H and FIGS. 3A~3H for exemplary illustration. The shape of the light-emitting structure 11 in top view can also be trapezoid, parallelogram, diamond, triangle, pentagon, hexagon, or round. The detailed structure can be referred to the descriptions of FIGS. 1A~1F.

Figure 2A:
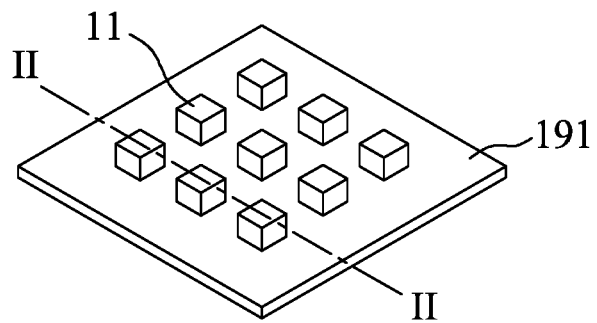
FIGS. 2A~2H show perspective views of making a light-emitting device in accordance with an embodiment of the present disclosure.
Figure 3A:
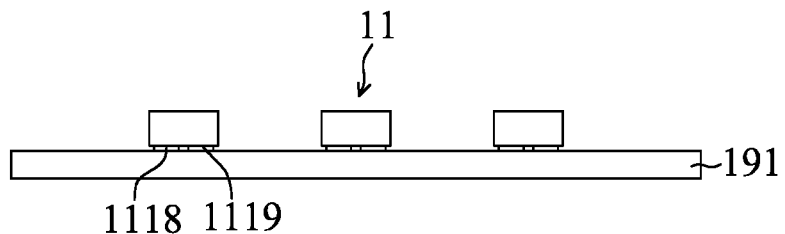
FIGS. 3A~3H show cross-sectional views taken along lines II-II of FIGS. 2A~2H, respectively.

Referring to FIGS. 2A and 3A, a plurality of light-emitting diodes 11 (nine light-emitting diodes are shown) is disposed on a first temporary tape 191. The electrode layers 1118, 1119 are attached to the first temporary tape 191. In one embodiment, the number and arrangement of light-emitting diodes 10 are exemplary, and not intended to limit the scope of the present disclosure.

Figure 2B:
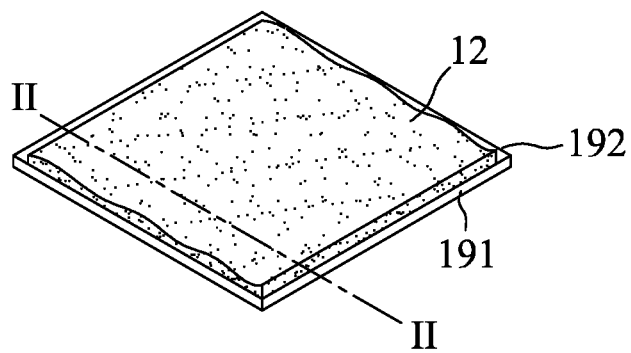
Figure 3B:
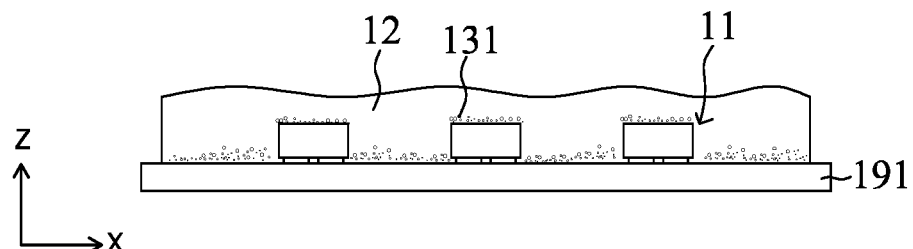

Referring to FIGS. 2B and 3B, a transparent body including a plurality of wavelength conversion particles 131 covers the light-emitting structure 11 completely. The light-emitting structures 11 are immersed within the transparent body and not exposed to environment (for example, ambient air). Thereafter, the transparent body is cured to form the light-transmitting body 12. In one embodiment, the transparent body can be formed on the light-emitting structure 11 by spraying, coating, dispensing or screen printing. If the transparent body is formed on the light-emitting structure 11 by spraying or dispensing, the transparent body has various heights (Z direction) at different locations across its whole area. After curing, the transparent body is cured to form the light-transmitting body 12 with different heights at different locations.

Moreover, because of gravity, during the curing, the wavelength conversion particles 131 are naturally precipitated and thus most of the wavelength conversion particles 131 can contact the light-emitting structure 11 and a portion of the wavelength conversion particles 131 is attached to the side surface of the light-emitting structure 11 (the detailed description is referred to FIGS. 1B and 1C). In another embodiment, it is possible to control the temperature and time of the curing to change distributions of the wavelength conversion particles 131. For example, the transparent body is fully cured before the wavelength conversion particles 131 do not precipitate near the bottom so the wavelength conversion particles 131 are suspended within the light-transmitting body 12 and do not contact the light-emitting structure 11. Or, an anti-precipitation agent (such as $TiO_2$) is added into the transparent body for preventing the wavelength conversion particles 131 from precipitating near the bottom during curing so the wavelength conversion particles 131 can be uniformly dispersed within the light-transmitting body 12.

In another embodiment, the transparent body with the wavelength conversion particles can be pre-formed as a wavelength conversion sheet and to adhere to the light-emitting structure 11. The adhesion is established by tightly sealing an upper mold (not shown) and a lower mold (not shown) with heat and pressure for softening the wavelength conversion sheet. Then, the wavelength conversion sheet tightly adheres to the light-emitting structure 11. Alternatively, the air is extracted out when the upper mold is very close to the lower mold and the wavelength conversion sheet does not contact the light-emitting structure 11. The bubble between the wavelength conversion sheet and the light-emitting structure 11 can be eliminated and the strength of joint can be enhanced.

Figure 2C:
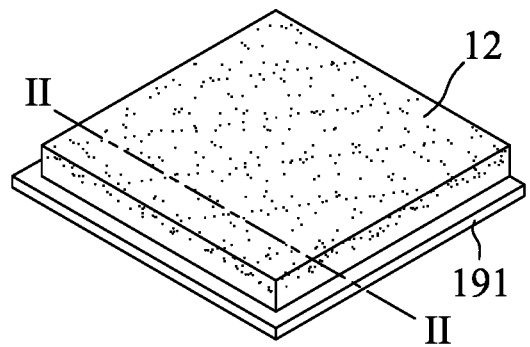
Figure 3C:
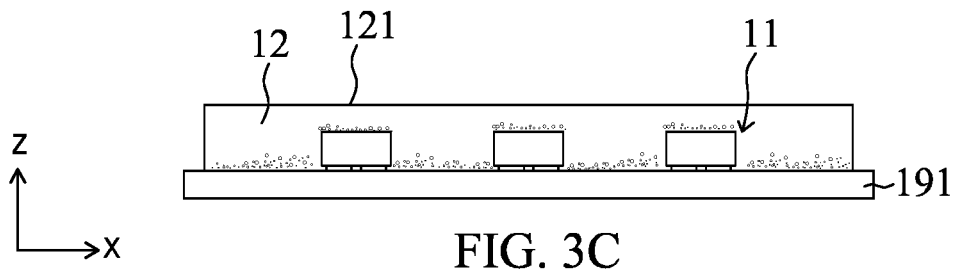

Referring to FIGS. 2C and 3C, a physical removal process is conducted to planarize the light-transmitting body 12 so the top surface 121 of the light-transmitting body 12 is substantially flat.

Figure 2D:
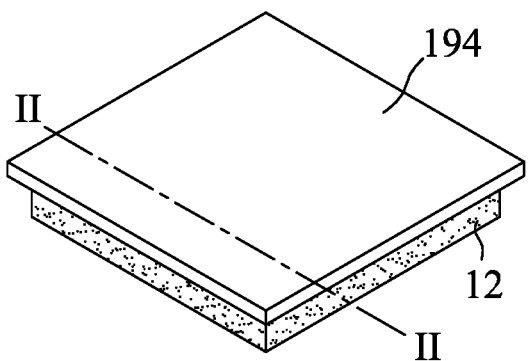
Figure 3D:
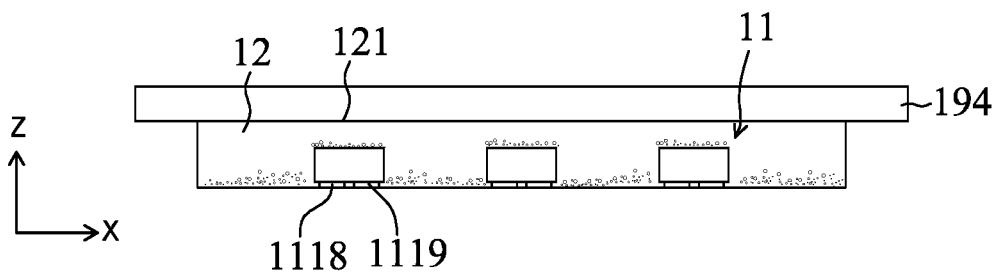

Referring to FIGS. 2D and 3D, a second temporary tape 194 is provided to attach to the top surface 121 of the light-transmitting body 12, and then the first temporary tape 191 is removed to expose the electrode layers 1118, 1119.

Figure 2E:
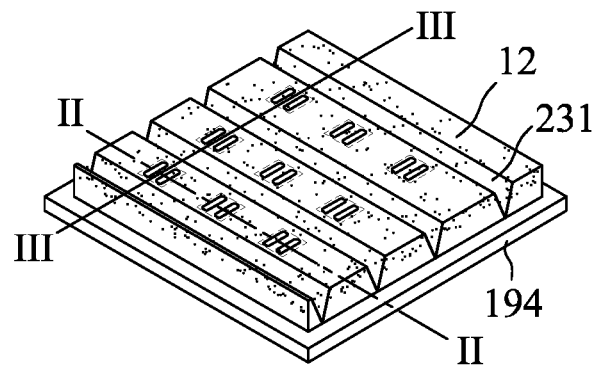
Figure 3E:
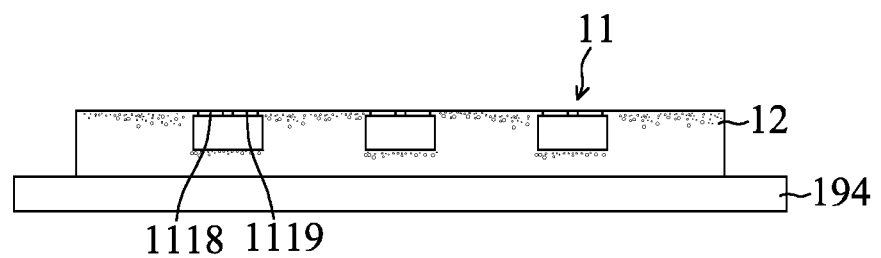
Figure 4A:
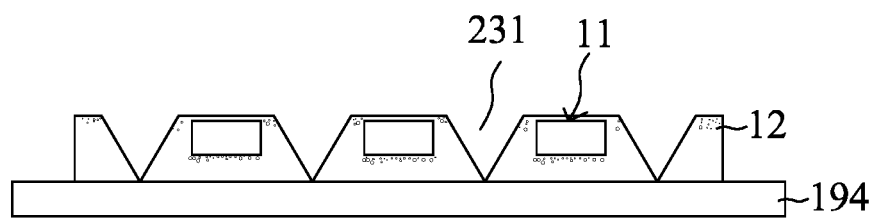
FIG. 4A shows a cross-sectional view taken along lines of FIG. 2E.

Referring to FIGS. 2E and 3E, the structure of FIG. 2D (or 3D) is reversed and a cutting process is performed to form a plurality of trenches 231 in the light-transmitting body 12. The cross-sectional shape of the trenches 231 is determined by the shape and size of the cutter using in the manufacturing. Due to the position of the section line, the trenches 231 is not shown in FIG. 3E. FIG. 4A show a cross-sectional view taken along line of FIG. 2E, and the trenches 231 are shown in FIG. 4A.

Figure 2F:
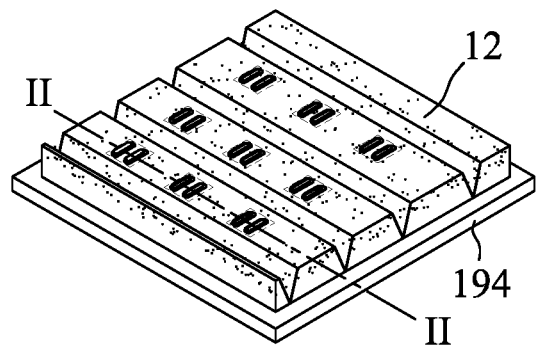
Figure 3F:
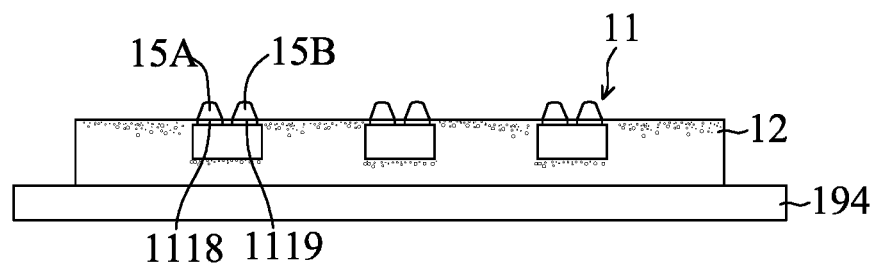

Referring to FIGS. 2F and 3F, a solder paste is coated on the electrode layers 1118, 1119 and a reflow process is performed to form the metal bumps 15A, 15B directly contacting the electrode layers 1118, 1119. Specifically, the solder paste is applied to the electrode layers 1118, 1119 and the solder paste has a projection area smaller than the electrode layers 1118, 1119 and covers only a part of the electrode layers 1118, 1119. Because the electrode layers 1118, 1119 have a bottommost layer made of Au, with the wetting reaction between Au layer and the solder paste, the solder paste will spread out to fully cover the corresponding electrode layers 1118, 1119. Furthermore, after the reflow process, the solder paste can be solidified to form the metal bumps 15A, 15B. In this stage, each of the metal bumps 15A, 15B is not subjected to a physical removal process (describer later) and has a contour without a sharp angle. The metal bumps 15A, 15B have a cross-sectional area gradually decreasing along the Z axis. In addition, due to manufacturing deviations, the metal bump 15A may have a shape different from that of the metal bump 15B. In FIG. 1B, the metal bump 15A has a cross-sectional view different from the metal bump 15B. The other detailed descriptions of the solder paste can be referred to aforesaid paragraphs and are omitted herein for brevity.

Figure 2G:
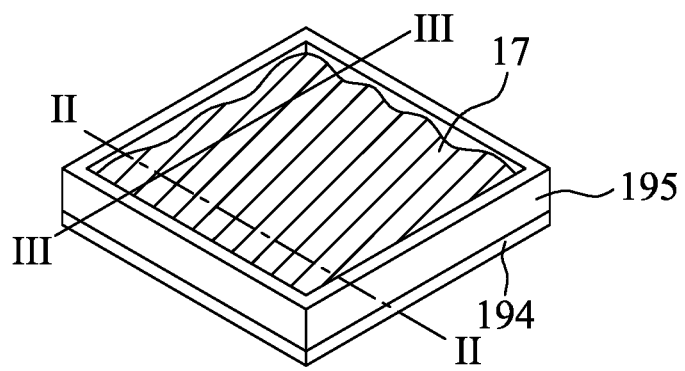
Figure 3G:
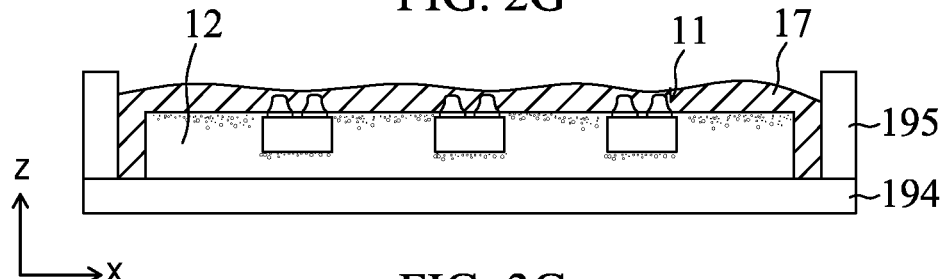

Referring to FIGS. 2G and 3G, a plurality of reflective particles is mixed into a matrix to form a paste in an uncured state, wherein the paste includes matrix and reflective particles and has a color determined by the reflective particles, which is generally white. Subsequently, the paste is added to cover the metal bumps 15A, 15B, the light-transmitting body 12 and the trenches 231 so the metal bumps 15A, 15B, and the light-transmitting body 12 are not exposed to environment (for example, ambient air), wherein the trenches 231 can be completely covered or partially covered by the paste or have bubble remaining in the paste, Then, the paste is cured to form the reflective layer 17. The reflective layer 17 has a height greater than that of the metal bumps 15A, 15B. The reflective layer 17 can be formed on the light-emitting structure 11 by spraying, coating, dispensing or screen printing. In the embodiment, the paste is formed by spraying or dispensing and has various heights (Z direction) at different locations across its whole area (as shown in FIG. 3G). After curing, the paste is cured to form the reflective layer 17 having different heights at different locations as well. Likewise, the reflective layer 17 can be a pre-formed sheet and adheres to the light-transmitting body 12. The description of the adhesion can be referred to the aforesaid paragraphs.

Figure 4B:
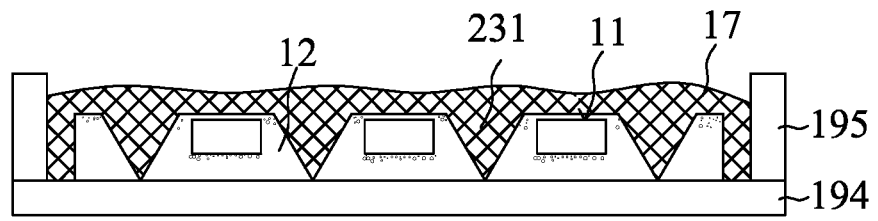
FIG. 4B shows a cross-sectional view taken along lines of FIG. 2G.

A dam 195 is optionally provided to confine a region. Accordingly, when filling the paste, the paste is confined within the region. Compared to the case without the dam 195, less amount of the paint is used. The structure showing the paste filling into the trenches 231 is shown in FIG. 4B.

Figure 2H:
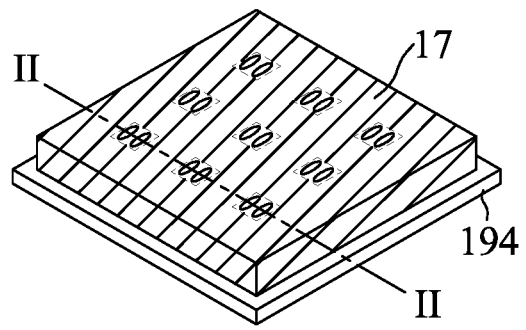
Figure 3H:
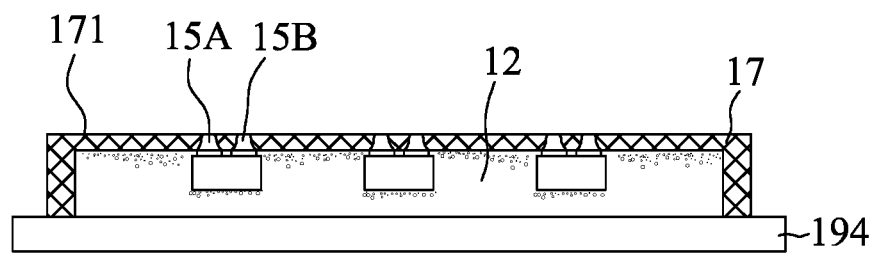

Referring to FIGS. 2H and 3H, the dam 195 is removed. A physical removal process is performed until the metal bumps 15A, 15B are exposed. In the physical removal process, a portion of the reflective layer 17 is removed to expose the metal bumps 15A, 15B. The physical removal process can be further performed to remove the reflective layer 17 and the metal bumps 15A, 15B simultaneously so the bottom surface 1714, 15A1, 15A2 are substantially coplanar with each other and the bottom surface 1714, 15A1, 15A2 are substantially flat. The other detailed descriptions can be referred to aforesaid paragraphs and are omitted herein for brevity.

In this embodiment, after the physical removal process, the maximum roughness (Ra1) of the bottom surface 15A1, 15B1 of the metal bumps 15A, 15B can be slightly larger than, equal to or slightly smaller than that of the bottom surface 1714 of the reflective layer 17 (Ra2). By alpha step film thickness measuring instrument in a measuring length of 50 μm, the difference (defined as the maximum roughness) between the highest point and the lowest point by measuring the bottom surface 15A1, 15B1 of the metal bumps 15A, 15B is Ra1. Likewise, by measuring the bottom surface 1714 of the reflective layer 17 in a measuring length of 50 μm, the difference between the highest point and the lowest point among the bottom surface 1714 of the reflective layer is Ra2; wherein 2 μm≤Ra1≤15 μm; 2 μm≤Ra2≤15 μm; 0≤|Ra2−Ra1|≤13 μm.

The physical removal process is conducted by machinery cutters. The cutter can be composed of high-carbon steel, diamond, ceramic or BN. During the removal process, only water (no slurry or chemical solution) is provided to lower the temperature which is raised due to friction between the cutter and the material to be cut (for example, the reflective layer or the light-transmitting body or the metal bump), and to wash the residue. Moreover, while the cutter having a hardness larger than that of the material to be cut is selected, a plurality of scratched lines (not shown) which can be observed by optical microscope is formed thereon. In another embodiment, by adjusting cutting parameters (for example, cutting speed or the material of the cutter), the scratched lines may not be observed by optical microscope.

Finally, a cutting step is performed (not shown) and the second temporary tape 194 is removed to form a plurality of light-emitting devices.

The temporary tape 191, 194 are used as a temporary carrier for mounting the light-emitting structure or the light-emitting device during manufacturing. The temporary tape 191, 194 includes blue tape, thermal release sheet or tape, UV release tape or polyethylene terephthalate (PET).

Figure 5A:
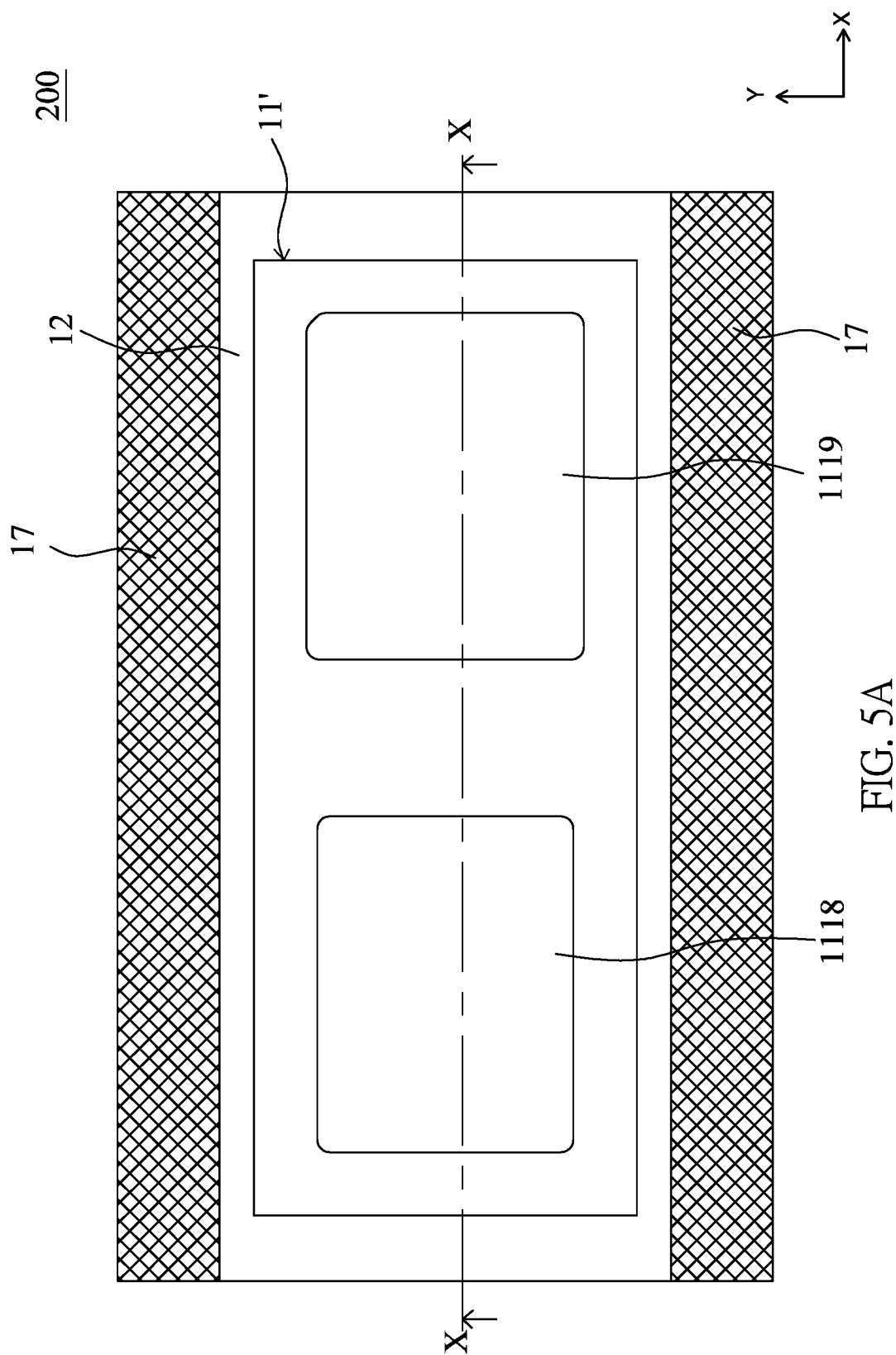
FIG. 5A shows a top view of a light-emitting device in accordance with an embodiment of the present disclosure.
Figure 5B:
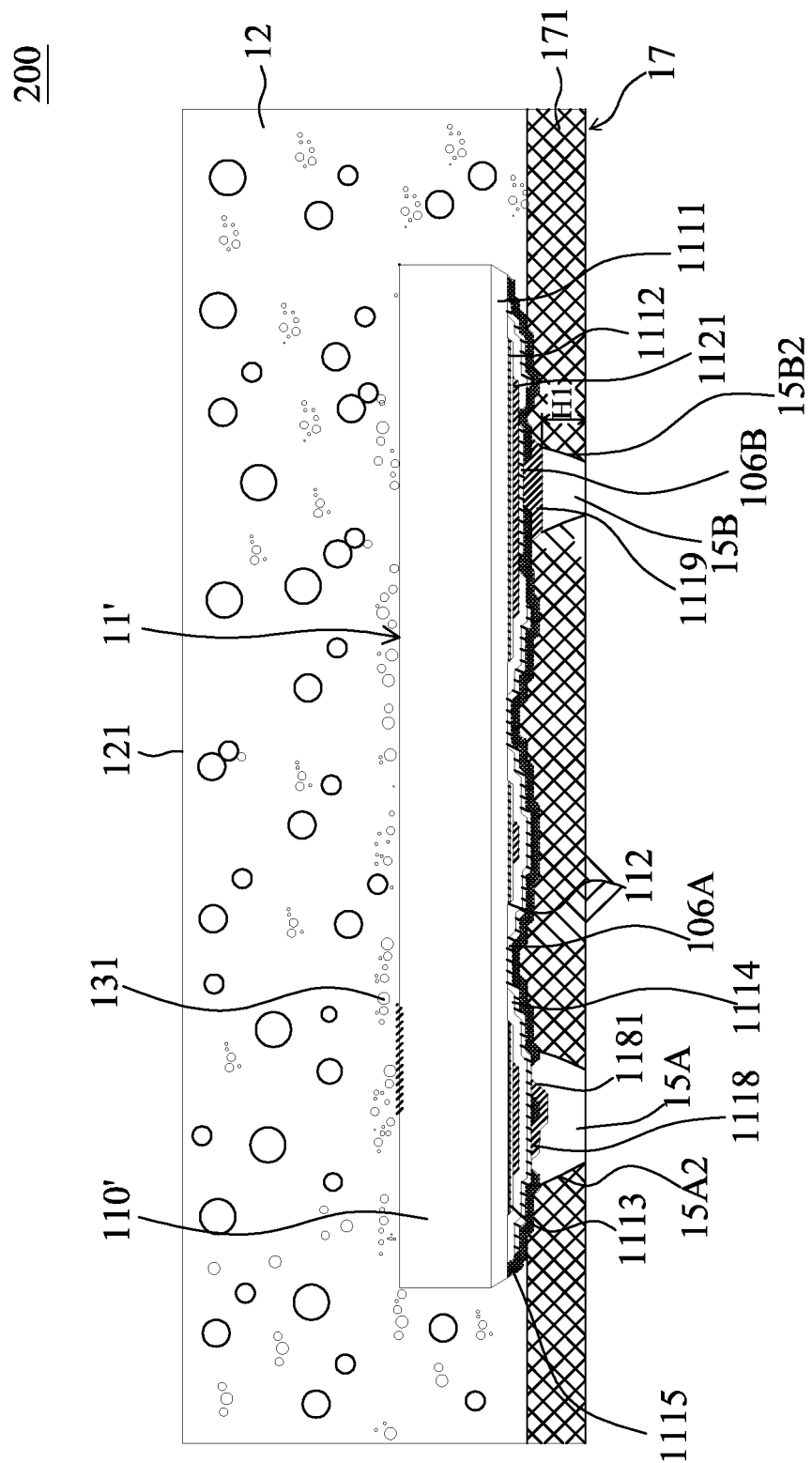
FIG. 5B shows a cross-sectional view taken along lines X-X of FIG. 5A.

FIG. 5A shows a top view of a light-emitting device 200 in accordance with an embodiment of the present disclosure. For clear illustration, FIG. 5A only shows some layers and each layer is drawn in solid line regardless of its material being non-transparent, transparent, or semi-transparent. FIG. 5B shows a cross-sectional view taken along lines X-X of FIG. 5A. Other views can be referred to the corresponding descriptions of the light-emitting device 100.

Referring to in FIGS. 5A and 5B, the light-emitting device 200 includes a light-emitting structure 11', a light-transmitting body 12, a plurality of wavelength conversion particles 131, metal bumps 15A, 15B, and a reflective layer 17. As shown in FIG. 5B, the light-emitting structure 11' merely includes one light-emitting body. The light-emitting body includes an un-patterned substrate 110', a first-type semiconductor layer 1111, an active layer 1112, and a second-type semiconductor layer 1113. In this embodiment, the wavelength conversion particles 131 are dispersed within the light-transmitting body 12 without precipitating near the bottom.

A trench 112 is formed to expose the first-type semiconductor layer 1111. A first insulation layer 1114 is formed in the trench 1112 and covers a portion of the first insulation layer 1114. A conductive layer 106A is formed on the first insulation layer 1114 and the first-type semiconductor layer 1111 uncovered by the first insulation layer 1114. A second insulation layer 1115 is formed to cover a portion of the conductive layer 106A. A mirror layer 1121 is formed on the second-type semiconductor layer 1113. A first electrode layer 1118 is formed on the conductive layer 106A uncovered by the second insulation layer 1115 and is electrically connected to the first-type semiconductor layer 1111 through the conductive layer 106A. The first electrode layer 1118 does not cover entire the conductive layer 106A so as to expose a portion of the conductive layer 106A. A metal bump 15A is formed to directly contact the first electrode layer 1118 and the conductive layer 106A exposed from the first electrode layer 1118. In addition, the metal bump 15A also covers or directly contacts a portion of the second insulation layer 1115. An ohmic contact layer is optionally formed between the second-type semiconductor layer 1113 and the mirror layer 1121 for lowering a driving voltage of the light-emitting device 200.

Furthermore, a conductive layer 106B is further formed on the mirror layer 1121. The second insulation layer 1115 is further formed to cover a portion of the conductive layer 106B. A second electrode layer 1119 is formed on the second insulation layer 1115 and the conductive layer 106B uncovered by the second insulation layer 1115 for electrically connecting to the second-type semiconductor layer 1113. The metal bump 15B is formed to directly contact the second electrode layer 1119. In operation, assuming the first-type semiconductor layer 1111 is a n-type semiconductor layer and the second-type semiconductor layer 1113 is a p-type semiconductor layer, when the light-emitting device is electrically connected to an external circuit, a current flows the metal bump 15B, the second electrode layer 1119, the conductive layer 106B, the mirror layer 1121, the second-type semiconductor layer 1113, the active layer 1112, the first-type semiconductor layer 1111, the conductive layer 106A, the first electrode layer 1118 and the metal bump 15A so the light-emitting device 200 emits light.

The bottom portion 171 of the reflective layer 17 covers and directly contacts the second insulation layer 1115 and sidewalls 15A2, 15B2 of the metal bumps 15A, 15B. The first electrode layer 1118 has a side surface 1181 directly covered by the metal bump 15A. The side surface 1181 does not directly contact the bottom portion 171. Other detailed descriptions can be referred to the corresponding paragraphs of the light-emitting device 100.

Figure 6A:
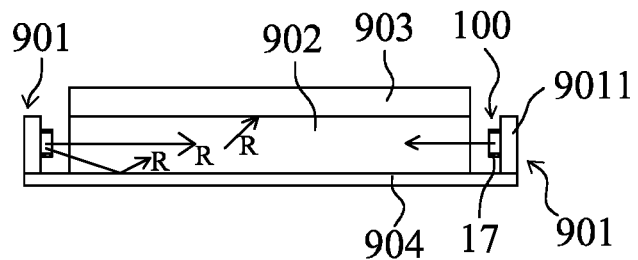
FIG. 6A shows a cross-sectional view of an edge-lit backlight unit of a liquid crystal display in accordance with an embodiment of the present disclosure.

FIG. 6A shows a cross-sectional view of an edge-lit backlight unit of a liquid crystal display in accordance with an embodiment of the present disclosure. The backlight unit includes a light source 901, a light guide plate 902, and a diffusing plate 903 disposed on the light guide plate 902. The light source 901 includes a carrier 9011, a plurality of light-emitting devices 100 disposed on the carrier 9011, and a circuit (not shown) formed on the carrier to control the light-emitting devices 100. The light source 901 is arranged at two side of the light guide plate 902. When the light-emitting device 100 emits light, since light (R) emits outward in the Z direction (to exit the light-emitting devices 100), the carrier 9011 is arranged perpendicular to the light guide plate 902 (that is, the light-emitting surface of the light-emitting device 100 is perpendicular to the carrier 9011) which can effectively directs the light (R) into the light guide plate 902.

When the light (R) emits into the light guide plate 902, the light guide plate 903 alters the direction of the light (R) toward the diffusing plate 903. Optionally, a reflector 904 can be disposed on the light guide plate 902 opposite to the diffusing plate 903 for reflecting the light (R). The metal bumps 15A, 15B of the light-emitting device 100 are directly mounted on the circuit of the carrier 9011 through solder. In other words, there is no submount between the metal bumps 15A, 15B and the carrier 9011. In one embodiment, the carrier 9011 and the reflector can be integrally formed as one-piece object and in an L-shape form. In addition, the light-emitting devices 100 are arranged on one side of the light guide plate 902 for reducing making cost and simplifying the assembly.

Figure 6B:
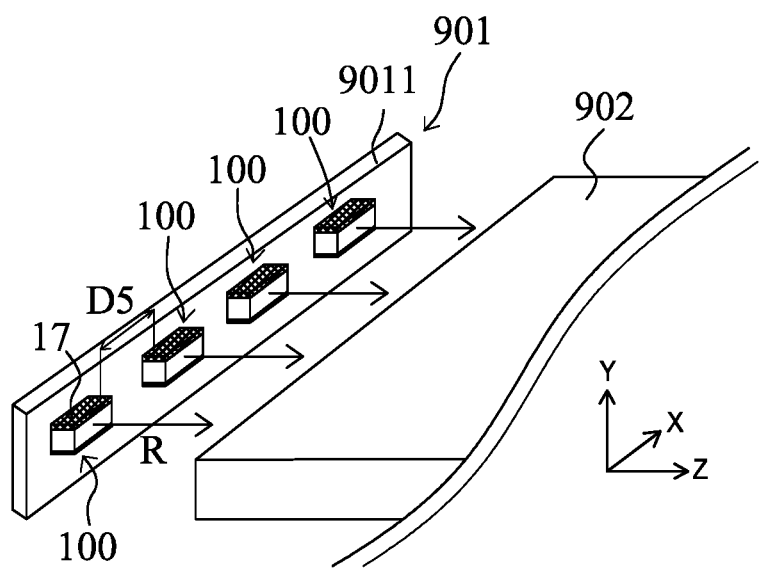
FIG. 6B shows a perspective view of a light source and a light-guiding plate.

FIG. 6B shows a perspective view of a light source 902 and the light-guiding plate 902 of FIG. 6A. The light-emitting devices 100 are arranged along the X direction to form one-dimensional array. The reflective layer 17 is parallel to the long side of the carrier 9011. In this embodiment, the number and arrangement of the light-emitting device 100 is illustrative, and not intended to limit the scope of the present disclosure. Since the light-emitting device 100 has the light-emitting angle of 130~150° in the long side direction (X direction), the distance (D5) between two adjacent light-emitting devices 100 ranges from 12 mm to 15 mm which does not cause dark area in the light guide plate 902. Based on different application, the distance (D5) can range from 4 mm to 15 mm.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device comprising:
   a light-emitting structure having a top surface, a bottom surface opposite to the top surface, a plurality of lateral surfaces between the top surface and the bottom surface, and an electrode layer;
   a light-transmitting body fully covering the top surface and the plurality of lateral surfaces of the light-emitting structure, and having a first side surface and a second side surface which are substantially perpendicular to each other;
   a reflective layer covering the first side surface without covering the second side surface; and
   a metal bump directly formed under the electrode layer, wherein the reflective layer has a bottommost surface having a plurality of scratched lines formed thereon.

2. The light-emitting device according to claim 1, wherein the bottom surface is covered by the reflective layer.

3. The light-emitting device of claim 1, wherein the light-transmitting body further has a third side surface and a fourth side surface, and the reflective layer covers the third side surface without covering the fourth side surface.

4. The light-emitting device of claim 3, wherein the first side surface faces the third side surface, and the second side surface faces the fourth side surface.

5. The light-emitting device of claim 1, wherein the metal bump has a sidewall covered by the reflective layer.

6. The light-emitting device of claim 1, wherein the light-emitting structure has an insulation layer having a portion covered by the metal bump.

7. The light-emitting device of claim 6, wherein the reflective layer covers the insulation layer.

8. The light-emitting device of claim 1, wherein the reflective layer has an inclined inner surface.

9. The light-emitting device of claim 8, wherein the bottom surface is inclined with respect to the inclined inner surface by an angle of 60°-80°.

10. The light-emitting device of claim 1, further comprising a plurality of wavelength conversion particles or a plurality of kinds of wavelength conversion particles.

11. The light-emitting device of claim 1, wherein the light-emitting structure comprises a patterned substrate and at least two light-emitting bodies commonly formed on the patterned substrate.

12. The light-emitting device of claim 1, wherein the light-emitting device merely has three light-emitting surfaces.

13. A backlight unit comprising:
    a light guide plate;
    a diffusing plate disposed on the light guide plate;
    a light source disposed on one side of the light guide plate, and having a carrier and the light-emitting device of claim 1 disposed on the carrier.

14. A liquid crystal display comprising the backlight unit of claim 13.

* * * * *